United States Patent
Huang et al.

(10) Patent No.: US 10,067,213 B2
(45) Date of Patent: Sep. 4, 2018

(54) PARALLEL MRI METHOD USING CALIBRATION SCAN, COIL SENSITIVITY MAPS AND NAVIGATORS FOR RIGID MOTION COMPENSATION

(75) Inventors: Feng Huang, Gainesville, FL (US); Wei Lin, Gainesville, GA (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1328 days.

(21) Appl. No.: 13/995,378

(22) PCT Filed: Dec. 16, 2011

(86) PCT No.: PCT/IB2011/055738
§ 371 (c)(1),
(2), (4) Date: Jun. 18, 2013

(87) PCT Pub. No.: WO2012/085796
PCT Pub. Date: Jun. 28, 2012

(65) Prior Publication Data
US 2013/0278263 A1 Oct. 24, 2013

Related U.S. Application Data

(60) Provisional application No. 61/425,971, filed on Dec. 22, 2010.

(51) Int. Cl.
*G01V 3/00* (2006.01)
*G01R 33/565* (2006.01)
(Continued)

(52) U.S. Cl.
CPC .... *G01R 33/56509* (2013.01); *G01R 33/5611* (2013.01); *G01R 33/5676* (2013.01); *G01R 33/58* (2013.01); *G01R 33/56325* (2013.01)

(58) Field of Classification Search
CPC ................................. G01R 33/56509
(Continued)

(56) References Cited

U.S. PATENT DOCUMENTS 5,427,101 A * 6/1995 Sachs ................ G01R 33/5676
324/309
6,516,210 B1 2/2003 Foxall
(Continued)

OTHER PUBLICATIONS

Nehrke, Kay et al "Prospective Correction of Affine Motion for Arbitrary MR Sequences on a Clinical Scanner", Resonance in Medicine, vol. 54, No. 5, 2005, pp. 1130-1138.
(Continued)

*Primary Examiner* — Louis Arana (57) ABSTRACT

Magnetic resonance (MR) calibration data are acquired using a plurality of radio frequency receive coils, and both coil sensitivity maps and reference projection vectors are generated based on the MR calibration data. During imaging, extra navigator projection vectors are acquired, or part of the imaging data can be used as navigator projection vectors. Partially parallel imaging (PPI) can performed to enhance the navigation information. The navigator projection vectors and the reference projection vectors are sensitivity weighted using the coil sensitivity maps to generate navigator sensitivity weighted projection vectors (navigator SWPV) and reference sensitivity weighted projection vectors (reference SWPV) respectively, and these are compared to generate subject position information. The subject motions are compensated prospectively or retrospectively using the generated subject position information. The motion compensation may be prospective, performed by adjusting an imaging volume of the PPI based on the subject position information.

20 Claims, 4 Drawing Sheets

(51) Int. Cl.
*G01R 33/561* (2006.01)
*G01R 33/567* (2006.01)
*G01R 33/58* (2006.01)
*G01R 33/563* (2006.01)

(58) Field of Classification Search
USPC .................................. 324/306, 307, 309
See application file for complete search history.

(56) References Cited

U.S. PATENT DOCUMENTS

| | | | |
|---|---|---|---|
| 6,788,759 B2 | 9/2004 | De Beek | |
| 7,432,710 B2 | 10/2008 | Takei | |
| 7,561,909 B1 | 7/2009 | Pai | |
| 7,587,074 B2 | 9/2009 | Zarkh | |
| 8,854,040 B2* | 10/2014 | Kannengiesser | G01R 33/5611 324/309 |
| 2011/0080167 A1* | 4/2011 | Kannengisser | G01R 33/56509 324/309 |
| 2015/0212182 A1* | 7/2015 | Nielsen | G01R 33/56509 702/191 |

OTHER PUBLICATIONS

Manke, Dirk et al "Novel Prospective Respiratory Motion Correction Approach for Free-Breathing Coronary MR Angiography using a Patient-Adapted Affine Motion Model", Magnetic Resonance in Medicine, vol. 50, No. 1, 2003, pp. 122-131.

Kalman, R.E. "A New Approach to Linear Filtering and Prediction Problems", Journal of Basic Engineering, vol. 82, Mar. 1960. pp. 35-45.

Eggers, H. et al "Real-Time Reconstruction for Sensitivity Encoded Magnetic Resonance Imaging", Proceedings of the Int'l Society on Magnetic Resonance Medicine, vol. 3, 1999, p. 1649.

Sachs, Todd S. et al "Real-Time Motion Detection in Spiral MRI using Navigators", MRM, vol. 32, 1994, pp. 639-645.

* cited by examiner

PARALLEL MRI METHOD USING CALIBRATION SCAN, COIL SENSITIVITY MAPS AND NAVIGATORS FOR RIGID MOTION COMPENSATION

CROSS-REFERENCE TO PRIOR APPLICATIONS

This application is the U.S. National Phase application under 35 U.S.C. § 371 of International Application No. PCT/IB2011/055738, filed on Dec. 16, 2011, which claims the benefit of U.S. Provisional Patent Application No. 61/425,971, filed on Dec. 22, 2010. These applications are hereby incorporated by reference herein.

The following relates to the magnetic resonance imaging arts, medical imaging arts, and related arts.

Magnetic resonance (MR) imaging is a known medical imaging technique, which is also employed in veterinary imaging and other imaging applications such as characterizing archaeological artifacts. For high resolution MR imaging of the human brain or other medical applications, subject motion can cause problematic degradation of image quality. In functional MR imaging (fMRI) such as brain fMRI, the acquisition time is extended in order to capture time-varying functional aspects. This extended acquisition time increases the likelihood and likely severity of motion artifacts.

Subject motion in MR imaging can be corrected prospectively or retrospectively. Real-time prospective correction methods update the coordinates of the imaging volume such that the position and orientation of the imaging volume tracks with the position and orientation of the subject over the course of the MR imaging data acquisition sequence repetitions. Retrospective correction methods entail adjustment (e.g., a rigid shift and/or regridding) of the MR imaging data after the acquisition.

Prospective motion correction has certain advantages. It ensures that the desired imaging region remains in view (that is, within the imaging volume) throughout the imaging sequence. In contrast, in retrospective motion correction the subject motion could move the desired imaging region outside of the imaging volume. Also, in prospective motion correction the imaging volume can be rotated commensurate with rotation of the imaging subject such that the MR acquisition axes remain aligned with anatomically significant axes (e.g., with axial, coronal, and sagittal axes).

To implement either prospective or retrospective motion correction, the subject motion must be quantitatively assessed. For prospective motion correction this assessment must be provided in real-time (that is, during the imaging and fast enough to provide feedback for adjusting the imaging volume coordinates between acquisition sequence repetitions). There are some hardware based motion assessment techniques, for example using a camera, optionally in conjunction with artificial fiducial markers applied to the subject. These hardware based methods provide real-time motion information, and also do not entail modification of the MR acquisition pulse sequence. However, the camera, artificial fiducial markers, or other equipment employed in hardware-based subject motion assessment increases cost and complicates the workflow. For example, set-up and alignment of the camera, and/or deployment of the artificial fiducial markers, increases imaging preparation time.

Navigator based methods are also known for real-time subject motion assessment. However, existing navigator based techniques are not well suited for use in conjunction with partially parallel imaging (PPI) employing multiple receive coils with different coil sensitivities. Moreover, existing navigator based techniques entail substantial modification of the acquisition sequence in order to acquire sufficient data with which to assess subject motion.

The following provides new and improved apparatuses and methods as disclosed herein.

In accordance with one disclosed aspect, a method comprises: acquiring magnetic resonance (MR) calibration data using a plurality of radio frequency receive coils; generating coil sensitivity maps for the radio frequency receive coils based on the MR calibration data; generating reference projection vectors based on the MR calibration data; acquiring extra navigators or using part of the imaging data as navigators; weighting the magnetic resonance navigator projection vectors and the reference projection vectors using the coil sensitivity maps to generate magnetic resonance navigator sensitivity weighted projection vectors (navigator SWPV) and reference sensitivity weighted projection vectors (reference SWPV) respectively; comparing the magnetic resonance navigator SWPV with the reference SWPV to generate the subject position information. and compensating the subject motion prospectively or retrospectively using the generated subject position information. In some such embodiments the method further comprises partially parallel imaging (PPI). The navigators are used to generate one or more reconstructed magnetic resonance images using PPI; comparing the reconstructed images with the reference projection vectors to generate subject position information; and compensating the subject motion prospectively or retrospectively using the generated subject position information. In some such embodiments the generating of subject position information comprises computing cross correlations between the navigator SWPV and reference projection vectors and generating the subject position information based on the computed cross correlations.

In accordance with another disclosed aspect, a method comprises: acquiring magnetic resonance (MR) calibration data using a plurality of radio frequency receive coils; generating coil sensitivity maps for the radio frequency receive coils based on the MR calibration data; acquiring magnetic resonance navigator projection vectors and sensitivity weighting the acquired magnetic resonance navigator projection vectors using the coil sensitivity maps to generate navigator sensitivity weighted projection vectors (navigator SWPV); performing magnetic resonance imaging; generating subject position information based on the navigator SWPV; and, in the magnetic resonance imaging, compensating for subject motion prospectively or retrospectively using the generated subject position information.

In accordance with another disclosed aspect, an apparatus comprises: a magnetic resonance (MR) scanner; a plurality of radio frequency receive coils; and a data processing device configured to cooperate with the MR scanner and the radio frequency receive coils to perform a method as set forth in any one of two immediately preceding paragraphs.

One advantage resides in providing real-time subject motion assessment without the use of extraneous hardware and with reduced modification of the MR acquisition sequence.

Another advantage resides in providing sensitivity weights with real-time subject motion assessment that accommodates different coil sensitivities of the phased array coils used in the modern MR systems.

Another advantage resides in providing PPI with real-time subject motion assessment without acquisition of additional reference data for the motion assessment.

Further advantages will be apparent to those of ordinary skill in the art upon reading and understanding the following detailed description.

Figure 1:
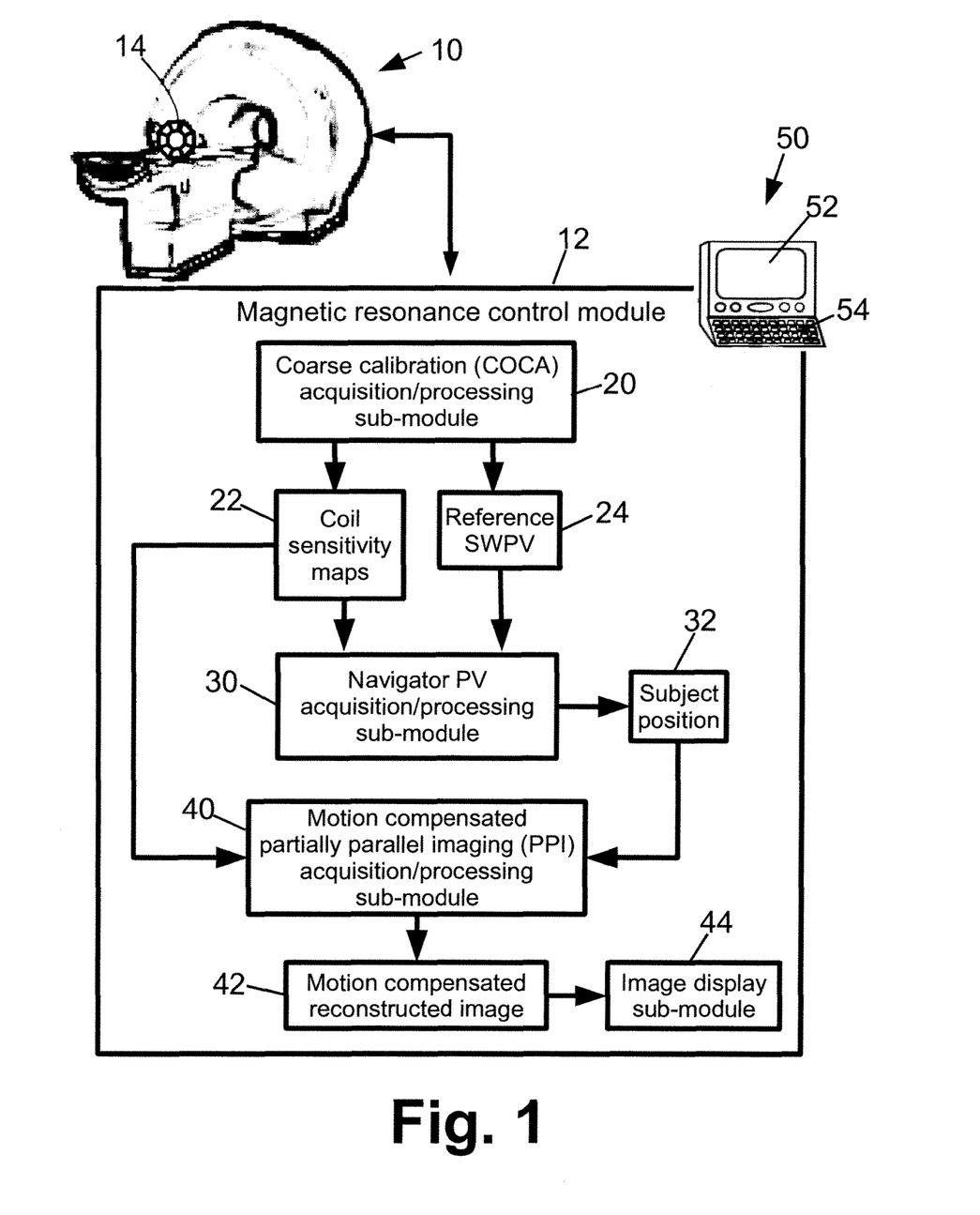
FIG. 1 diagrammatically shows an imaging system configured to perform motion-corrected magnetic resonance imaging as disclosed herein.

With reference to FIG. 1, an imaging system includes a magnetic resonance (MR) scanner 10, such as an illustrated Achieva™ MR scanner (available from Koninklijke Philips Electronics N.V., Eindhoven, The Netherlands), or an Intera™ or Panorama™ MR scanner (both also available from Koninklijke Philips Electronics N.V.), or another commercially available MR scanner, or a non-commercial MR scanner, or so forth. In a typical embodiment, the MR scanner includes internal components (not illustrated) such as a superconducting or resistive main magnet generating a static ($B_0$) magnetic field, sets of magnetic field gradient coil windings for superimposing selected magnetic field gradients on the static magnetic field, a radio frequency excitation system for generating a radio frequency ($B_1$) field at a frequency selected to excite magnetic resonance (typically $^1H$ magnetic resonance, although excitation of another magnetic resonance nuclei or of multiple magnetic resonance nuclei is also contemplated), and a radio frequency receive system including a radio frequency receive coil array, or a plurality of receive coils, for detecting magnetic resonance signals emitted from the subject.

The MR scanner 10 operates under control of a magnetic resonance (MR) control module 12 to perform magnetic resonance (MR) imaging with motion correction. In some embodiments, the MR imaging is partially parallel imaging (PPI). In PPI, imaging data are acquired by a plurality of magnetic resonance receive channels, for example including radio frequency receive coils of a diagrammatically illustrated receive coil array 14. Substantially any PPI technique can be employed, such as sensitivity encoding (SENSE), simultaneous acquisition off spatial harmonics (SMASH), generalized autocalibrating partially parallel acquisition (GRAPPA), or so forth. In PPI, a plurality of receive coils having different coil sensitivities acquire an undersampled MR imaging dataset that is missing some data (for example, skipping acquisition of some phase encoding lines as is done in SENSE). The missing data are compensated by additional information provided by the use of a plurality of receive coils with different coil sensitivities, using a suitable reconstruction technique (e.g., a SENSE or SMASH reconstruction technique). The undersampling of the acquired PPI dataset corresponds to an imaging data acquisition acceleration factor (typically denoted R) whose magnitude depends upon the extent of undersampling.

PPI techniques entail a pre-scan for determining the coil sensitivities. Typically, the coil sensitivities vary relatively gradually across space. Accordingly, a coarse calibration (COCA) pre-scan is suitably performed by a COCA acquisition/processing sub-module 20. Coil sensitivity maps 22 for the coils of the plurality of coils 14 are generated by the COCA acquisition/processing sub-module 20. More generally, the sub-module 20 acquires MR calibration data and generates coil sensitivity maps therefrom. As disclosed herein, the COCA acquisition/processing sub-module 20 also generates reference projection vectors (PV) for use in subject motion assessment from the COCA prescan or other MR calibration data. Optionally, as further disclosed herein, the generated reference PV may be weighted to account for the coil sensitivities using the information contained in the coil sensitivity maps 22—this results in reference sensitivity weighted projection vectors (reference SWPV) 24. Advantageously, this disclosed approach uses information conventionally acquired as part of the PPI process, namely the COCA pre-scan or other MR calibration data used to generate the coil sensitivity maps, to also generate reference data (e.g., reference SWPV 24) for use in subject motion detection.

With continuing reference to FIG. 1, subject motion assessment is performed by a navigator projection vector (PV) acquisition/processing sub-module 30 to generate a subject position 32. The acquired PV can be either extra data or part of the imaging data, for example the echo train in a Turbo spin echo sequence, or several radial projections in a radial trajectory. The navigator PV acquisition/processing sub-module 30 acquires navigator PV, optionally performs sensitivity weighting of the navigator PV based on the coil sensitivity maps 22 to generate navigator sensitivity weighted PV (navigator SWPV) and compares the navigator SWPV with the reference SWPV 24 to determine the subject position 32 including three-dimensional rigid translation and rotation components. In illustrative embodiments, the comparisons between navigator and reference SWPV suitably employ cross-correlation.

With continuing reference to FIG. 1, a motion compensated MR acquisition/processing sub-module 40 acquires MR data for an imaging volume that is adjusted to be consonant with the subject position 32 determined from the most recent iteration of navigator PV acquisitions, and performs a suitable image reconstruction process (e.g., SENSE reconstruction processing or so forth) to generate a motion compensated reconstructed image. In some embodiments, the MR acquisition sequence is a partially parallel imaging (PPI) imaging sequence, although non-PPI acquisition sequences are also suitable. The motion compensation can be performed either prospectively or retrospectively. If a retrospective motion compensation scheme is adopted and the imaging includes acquisition of multiple images over a period of time, as (by way of illustrative example) in the case of brain fMRI, then the reconstruction optionally also includes performing a rigid translational/rotational adjustment of each reconstructed image to register all images with a suitable spatial reference. For example, each image can be translated and rotated to match with the spatial reference of the reference SWPV 24 based on the subject motion corresponding to the subject position 32. In this way, all images of the fMRI (or other) sequence of images are spatially aligned and functional (or other) variations over time can be readily assessed based on the sequence of images.

In the case of brain fMRI or another image sequence acquisition, the navigator PV acquisition/processing sub-module 30 is suitably applied before each image acquisition repetition in order to acquire a current value for the subject position 32 which is then used to define the imaging volume of the subsequent acquisition performed by the motion-compensated MR acquisition/processing sub-module 40. For each repetition, the subject position 32 is determined respective to the reference SWPV 24, and hence the subject position 32 is always referenced to the common spatial reference of the reference SWPV 24. Although brain fMRI is disclosed as an illustrative example, the disclosed approach is suitably employed in any imaging over a time interval sufficient for prospective motion compensation to be advantageously performed.

As another example, if the acquisition of a single image is sufficiently long, then the navigator PV acquisition/processing sub-module 30 may be invoked at intervals during the acquisition of imaging data for the single image and the imaging volume suitably adjusted during acquisition of the imaging data for the single image based on the subject position 32 provided by the most recent navigator PV acquisition.

With continuing reference to FIG. 1, an image display sub-module 44 suitably displays the motion compensated reconstructed image 42. In embodiments in which a sequence of images are acquired, the image display sub-module 44 may display a CINE sequence of the images, or may display the images of the sequence in a suitable matrix, or so forth.

In the illustrated embodiment, the MR control module 12 is embodied by an illustrative computer 50 whose processor (which may, for example, comprise a multi-core processor or other parallel processor, a single-core processor, a graphical processing unit, i.e. GPU, or so forth) is programmed to implement the sub-modules 20, 30, 40 including control of the MR scanner 10 to cause the MR scanner 10 to perform the requisite data acquisitions. While the processor is generally a digital processor, it is contemplated for the processor to include or incorporate some analog circuitry, such as by way of illustrative example application-specific integrated circuitry (ASIC) configured to perform some or all of the image reconstruction processing of the sub-module 40. The disclosed motion compensation approaches may also be embodied as a storage medium storing instructions that when executed by a processor perform the operations of the various sub-modules 20, 30, 40. For example, the storage medium may comprise a hard drive, optical drive, random access memory (RAM), FLASH memory, or other electrostatic memory, various combinations thereof, or another suitable storage medium. The illustrative computer 50 includes a display 52 via which the image display sub-module 44 displays the motion compensated reconstructed image 42 (or a CINE sequence or array of such images). The computer 50 also include an illustrative keyboard 54 or other user input device (e.g., a mouse, trackball, or other pointing device) via which a user inputs commands, parameters, or so forth for initiating and controlling the imaging process.

Having described the illustrative embodiment of FIG. 1, additional disclosure relating to the various sub-modules 20, 30, 40 is now set forth.

Figure 2:
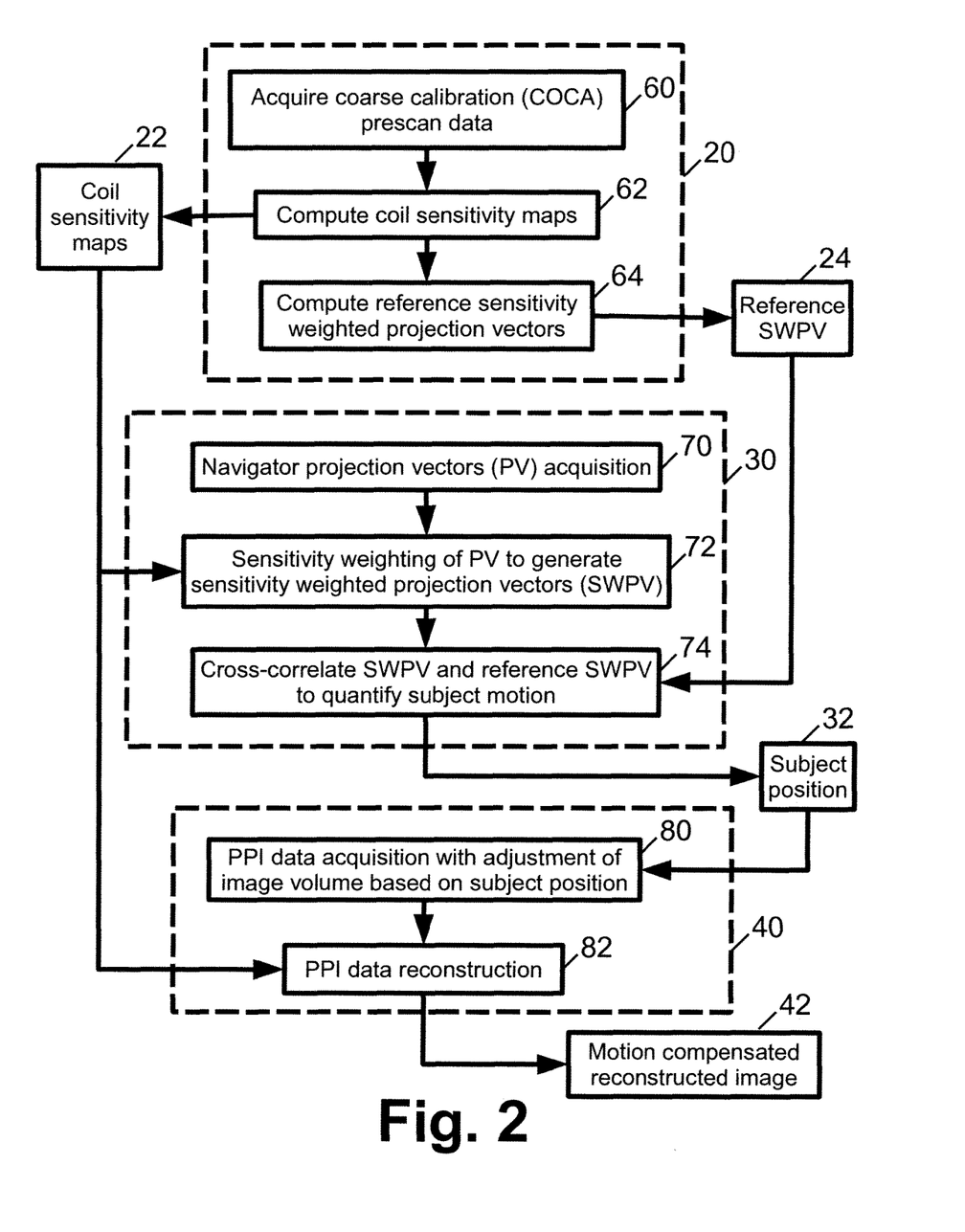
FIG. 2 diagrammatically shows processing performed by selected processing sub-modules of the magnetic resonance control module of FIG. 1.

With reference to FIG. 2, the COCA acquisition/processing sub-module 20 causes the MR scanner 10 and the plurality of radio frequency receive coils 14 to acquire coarse calibration (COCA) prescan data in an operation 60. In an operation 62, the coil sensitivity maps 22 are computed based on the COCA prescan data. In an operation 64, the reference SWPV 24 is computed using the same COCA prescan data (or a subset thereof) that are used to compute the coil sensitivity maps 22 in the operation 62. In this way no additional data are acquired in order to generate the reference SWPV 24. The size of the reference SWPV 24 for use in motion detection is suitably (1) the number of radio frequency receive coils in the plurality 14 times three navigators per coil (corresponding to three orthogonal directions, e.g. Cartesian x, y, and z directions) times the number of readouts. The reference SWPV 24 is suitably represented as a stack of the navigators from all receive coils after processing by a one-dimensional fast Fourier transform (1D-FFT). The reference SWPV 24 calculation operation 64 is performed after the COCA data acquisition operation 60, with the sensitivity weighting being performed after the coil sensitivity maps 22 are computed in the operation 62. After the calculation of extrapolated sensitivity maps, the three-dimensional low resolution image acquired in the operation 60 is rotated and translated in a given range. For each location, the projection vector is calculated, sensitivity-weighted, and saved. One embodiment for the calculation of SWPV at many locations in a fast way is to re-grid the Cartesian data onto 3D radial trajectory. This embodiment is reasonable if the sensitivity maps change smoothly in spatial domain.

With continuing reference to FIG. 2, the navigator projection vector (PV) acquisition/processing sub-module 30 operates as follows. In an acquisition operation 70 the sub-module 30 causes the MR scanner 10 and the plurality of radio frequency receive coils 14 to acquire magnetic resonance navigator projection vectors (PV). In an operation 72, these PV are sensitivity weighted using the coil sensitivity maps 22 to generate magnetic resonance navigator sensitivity weighted projection vectors (magnetic resonance navigator SWPV). In an operation 74, the navigator SWPV are compared with the reference SWPV 24 to quantitatively assess the subject position 32 at the time of the acquisition 70 referenced to the position indicated by the reference SWPV 24. In a suitable comparison approach, a cross correlation between the acquired magnetic resonance SWPV and the reference SWPV 24 is computed. Since each calculated projection vector corresponds to a location of the reference image, the calculated projection vector providing the maximum cross correlation gives the current position of the subject. To avoid the computational cost of calculating all cross correlations, the extended Kalman filter is optionally applied to predict the range of the next subject position based on the current subject position. See Kalman, "A new approach to linear filtering and prediction problems", Trans. ASME J. Basic Eng. Vol. 82 (series D) pages 35-45 (1960).

With continuing reference to FIG. 2, the motion compensated MR acquisition/processing sub-module 40 operates as follows. In an acquisition operation 80 the sub-module 40 causes the MR scanner 10 and the plurality of radio frequency receive coils 14 to acquire imaging data in an imaging volume. Prospective motion compensation is incorporated into the operation 80 by adjusting the imaging volume to align with the subject position 32 indicated by the most recently iteration of the acquisition/processing operations 70, 72, 74. The resulting imaging data are reconstructed in an operation 82 using a suitable image reconstruction technique. Optionally, the motion compensation can be done retrospectively and the image reconstruction operation 82 may include performing a rigid shift/rotation of the resulting image to align with the reference position indicated by the reference SWPV 24.

The disclosed imaging process of FIG. 2 is an illustrative example, and numerous variations are contemplated. For example, the sensitivity weighting of the reference projection vectors and of the magnetic resonance navigator projection vectors is optionally omitted.

As another example, other data besides the COCA prescan that is acquired prior to performing the PPI may be used to generate the reference projection vector (or reference sensitivity weighted projection vector). Thus, for example, the reference projection vectors may be acquired separately from the COCA prescan prior to initiating the imaging.

As yet another example, while prospective motion compensation is employed in the illustrative example of FIG. 2, it is alternatively contemplated to employ retrospective motion compensation. In this variant embodiment, the generated subject position 32 is input to the data reconstruction operation 82 (or to a post-reconstruction motion compensation operation that is not illustrated) instead of being input to the acquisition operation 80, and the subject position 32 is used retrospectively, that is, after the imaging data acquisition, to perform a rigid shift/rotation of the acquired imaging data or of the reconstructed image in order to compensate for motion respective to the reference position of the reference SWPV 24.

Figure 3:
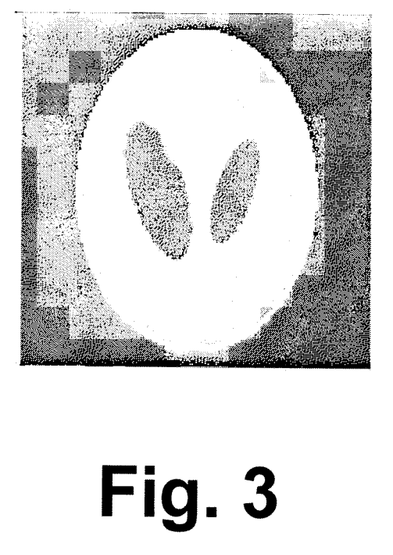
FIGS. 3-5 show phantom imaging results as described herein.
Figure 4:
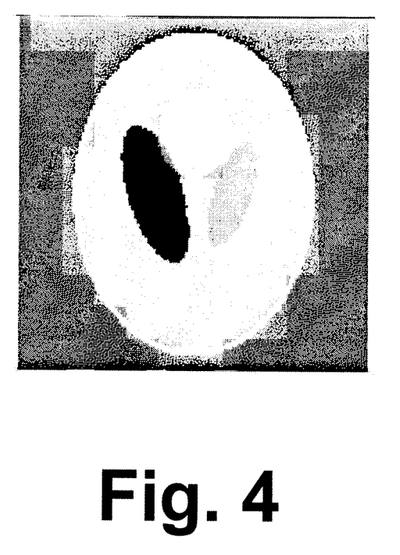
Figure 5:
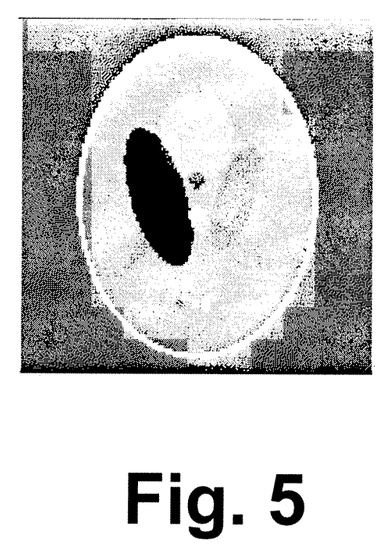

With reference to FIGS. 3-5, some illustrative phantom imaging results are shown. In this phantom example, a 32-channel cardiac coil and Shepp-Logan phantom was used to produce the simulated data set. FIG. 3 shows the images for the reference scan operation 60 and the navigators. It is assumed here that the image contrast may change between the pre-scanned reference and the navigator acquisitions due to different steady-states of magnetization. FIGS. 4 and 5 show the navigator with 13% contrast change and with 42% contrast change, respectively.

Figure 6:
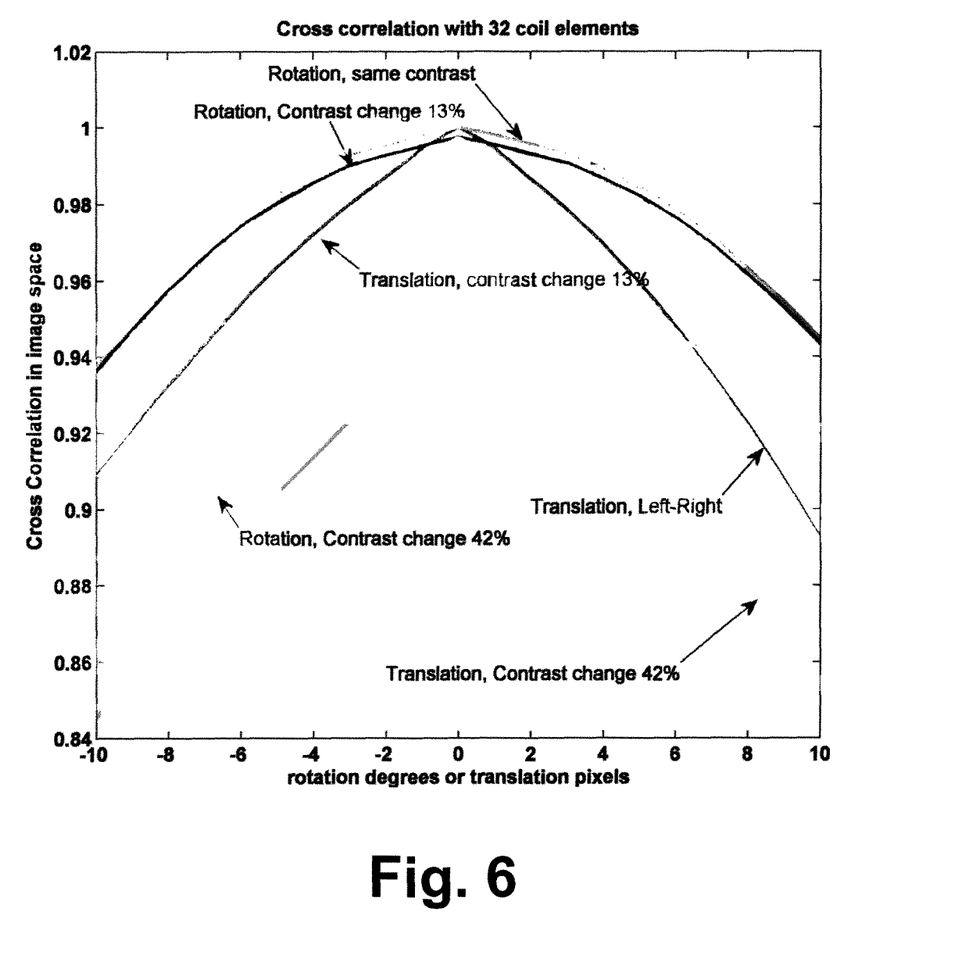
FIG. 6 plots calculated cross correlation between the acquired and calculated projection vectors for different subject motion conditions as described herein.

With reference to FIG. 6, the change of cross correlation between calculated reference SWPV 24 and projection vectors acquired in the operation 70 due to motion are plotted. The data of FIG. 6 are calculated results for the same phantom example as in FIGS. 3-5, and are calculated for the same 32-channel cardiac coil. It is seen that the cross correlation is maximized when there is no relative motion between the reference SWPV 24 and the navigator (sensitivity weighted) projection vectors. When the contrast change between the reference image and the navigator is not significant, both rotation and translation can be sensitively detected.

This application has described one or more preferred embodiments. Modifications and alterations may occur to others upon reading and understanding the preceding detailed description. It is intended that the application be construed as including all such modifications and alterations insofar as they come within the scope of the appended claims or the equivalents thereof.

Having thus described the preferred embodiments, the invention is now claimed to be:

1. A method comprising:
    acquiring magnetic resonance calibration data using a plurality of radio frequency receive coils;
    generating coil sensitivity maps for the radio frequency receive coils based on the MR calibration data;
    generating reference projection vectors based on the MR calibration data;
    performing magnetic resonance imaging including acquiring magnetic resonance imaging data;
    generating magnetic resonance navigator projection vectors based on a portion of the acquired magnetic resonance imaging data or extra data acquired with the magnetic resonance imaging data;
    comparing the magnetic resonance navigator projection vectors with the reference projection vectors to generate subject position information; and
    in the magnetic resonance imaging, compensating for subject motion prospectively or retrospectively using the generated subject position information.

2. The method as set forth in claim 1, further comprising:
    sensitivity weighting the magnetic resonance navigator projection vectors and the reference projection vectors using the coil sensitivity maps to generate magnetic resonance navigator sensitivity weighted projection vectors (navigator SWPV) and reference sensitivity weighted projection vectors (reference SWPV) respectively;
    wherein the comparing comprises comparing the magnetic resonance navigator SWPV with the reference SWPV to generate the subject position information.

3. The method as set forth in claim 2, wherein the comparing comprises:
    computing cross correlations between the magnetic resonance navigator SWPV and the reference SWPV; and
    generating the subject position information based on the computed cross correlations.

4. The method as set forth in claim 1, wherein the comparing comprises:
    computing cross correlations between the magnetic resonance navigator projection vectors and the reference projection vectors; and
    generating the subject position information based on the computed cross correlations.

5. The method as set forth in claim 1, wherein the magnetic resonance imaging comprises partially parallel imaging (PPI) selected from a group consisting of sensitivity encoding (SENSE), simultaneous acquisition off spatial harmonics (SMASH), generalized autocalibrating partially parallel acquisition (GRAPPA).

6. The method as set forth in claim 1, further comprising: displaying the one or more reconstructed magnetic resonance images on a display device.

7. The method as set forth in claim 1, wherein the one or more reconstructed magnetic resonance images comprise a time sequence of reconstructed magnetic resonance images and the method further comprises:
    displaying a CINE sequence of the time sequence of reconstructed magnetic resonance images on a display device.

8. The method as set forth in claim 1, wherein the compensating comprises:
    performing prospective motion compensation by adjusting an imaging volume based on the generated subject position information.

9. The method as set forth in claim 1, wherein the compensating comprises:
    performing retrospective motion compensation based on the subject position information.

10. The method as set forth in claim 1, wherein at least the generating of coil sensitivity maps, the generating of reference projection vectors, and the comparing of the magnetic resonance navigator projection vectors with the reference projection vectors are performed by a digital processor.

11. A method comprising:
    acquiring magnetic resonance (MR) calibration data using a plurality of radio frequency receive coils;
    generating coil sensitivity maps for the radio frequency receive coils based on the MR calibration data;
    acquiring magnetic resonance navigator projection vectors and sensitivity weighting the acquired magnetic resonance navigator projection vectors using the coil sensitivity maps to generate navigator sensitivity weighted projection vectors (navigator SWPV);
    performing magnetic resonance imaging;
    generating subject position information based on the navigator SWPV; and
    in the magnetic resonance imaging, compensating for subject motion prospectively or retrospectively using the generated subject position information.

12. The method as set forth in claim 11, wherein the generating of subject position information comprises:

computing cross correlations between the navigator SWPV and reference projection vectors; and
generating the subject position information based on the computed cross correlations.

13. The method as set forth in claim 12, further comprising:
sensitivity weighting the reference projection vectors using the coil sensitivity maps to generate reference sensitivity weighted projection vectors (reference SWPV);
wherein the computing cross correlations comprises computing cross correlations between the navigator SWPV and the reference SWPV.

14. The method as set forth in claim 12, further comprising:
generating the reference projection vectors based on magnetic resonance data acquired prior to acquiring imaging data.

15. The method as set forth in claim 12, further comprising:
generating the reference projection vectors based on the MR calibration data.

16. The method as set forth in claim 11, wherein the magnetic resonance imaging comprises partially parallel imaging (PPI) selected from a group consisting of sensitivity encoding (SENSE), simultaneous acquisition off spatial harmonics (SMASH), generalized autocalibrating partially parallel acquisition (GRAPPA).

17. The method as set forth in claim 11, further comprising:
displaying a motion-compensated reconstructed magnetic resonance image generated by the magnetic resonance imaging and compensating on a display device.

18. The method as set forth in claim 11, wherein the compensating comprises:
performing prospective motion compensation by adjusting an imaging volume based on the generated subject position information.

19. The method as set forth in claim 11, wherein at least the generating of coil sensitivity maps, the sensitivity weighting of the acquired magnetic resonance navigator projection vectors, and the generating of subject position information are performed by a digital processor.

20. An apparatus comprising:
a magnetic resonance (MR) scanner;
a plurality of radio frequency receive coils; and
a data processing device configured to cooperate with the MR scanner and the radio frequency receive coils to
acquire MR calibration data using the plurality of radio frequency receive coils;
generate coil sensitivity maps for the radio frequency receive coils based on the MR calibration data;
generating reference projection vectors based on the MR calibration data;
performing MR imaging including acquiring MR imaging data;
generating MR navigator projection vectors based on a portion of the acquired MR imaging data or extra data acquired with the MR imaging data;
comparing the MR navigator projection vectors with the reference projection vectors to generate subject position information; and
in the MR imaging, compensating for subject motion prospectively or retrospectively using the generated subject position information.

* * * * *